(12) United States Patent
Mori et al.

(10) Patent No.: US 10,309,036 B2
(45) Date of Patent: Jun. 4, 2019

(54) METHOD FOR MANUFACTURING GROUP-III NITRIDE SEMICONDUCTOR CRYSTAL SUBSTRATE

(71) Applicants: OSAKA UNIVERSITY, Suita-shi (JP); SUMITOMO CHEMICAL COMPANY, LIMITED, Tokyo (JP)

(72) Inventors: Yusuke Mori, Suita (JP); Masashi Yoshimura, Suita (JP); Mamoru Imade, Suita (JP); Masatomo Shibata, Hitachi (JP); Takehiro Yoshida, Hitachi (JP)

(73) Assignees: OSAKA UNIVERSITY, Suita-Shi, Osaka (JP); SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/555,004

(22) PCT Filed: Feb. 18, 2016

(86) PCT No.: PCT/JP2016/054743
§ 371 (c)(1),
(2) Date: Aug. 31, 2017

(87) PCT Pub. No.: WO2016/140074
PCT Pub. Date: Sep. 9, 2016

(65) Prior Publication Data
US 2018/0038010 A1 Feb. 8, 2018

(30) Foreign Application Priority Data
Mar. 3, 2015 (JP) .................. 2015-041830

(51) Int. Cl.
*C30B 23/02* (2006.01)
*C30B 19/02* (2006.01)
(Continued)

(52) U.S. Cl.
CPC .............. *C30B 19/02* (2013.01); *C30B 25/20* (2013.01); *C30B 29/406* (2013.01);
(Continued)

(58) Field of Classification Search
CPC ......... C30B 29/38; C30B 19/00; C30B 19/12; C30B 19/02; C30B 23/00; C30B 23/02; C30B 23/025
See application file for complete search history.

(56) References Cited

U.S. PATENT DOCUMENTS 8,002,892 B2    8/2011  Hirota et al.
9,834,863 B2 *  12/2017 Hashimoto ............. C30B 7/105
(Continued)

FOREIGN PATENT DOCUMENTS

JP    2005-298269 A    10/2005
JP    2009-029639 A    2/2009
(Continued)

OTHER PUBLICATIONS

International Search Report (ISR) (PCT Form PCT/ISA/210), in PCT/JP2016/054743, dated Apr. 19, 2016.
(Continued)

*Primary Examiner* — Robert M Kunemund
(74) *Attorney, Agent, or Firm* — McGinn I. P. Law Group, PLLC

(57) ABSTRACT

A method for manufacturing a group III nitride semiconductor crystal substrate includes providing, as a seed crystal substrate, a group III nitride single crystal grown by a liquid phase growth method, and homoepitaxially growing a group III nitride single crystal by a vapor phase growth method on a principal surface of the seed crystal substrate. The principal surface of the seed crystal substrate is a +c-plane, and the seed crystal substrate has an atomic oxygen concentra-
(Continued)

tion of not more than $1\times10^{17}$ cm$^{-3}$ in a crystal near the principal surface over an entire in-plane region thereof.

19 Claims, 11 Drawing Sheets

(51) Int. Cl.
  *C30B 25/20* (2006.01)
  *C30B 29/40* (2006.01)
  *H01L 21/02* (2006.01)
(52) U.S. Cl.
  CPC .... *H01L 21/02024* (2013.01); *H01L 21/0242* (2013.01); *H01L 21/0254* (2013.01); *H01L 21/0262* (2013.01); *H01L 21/02389* (2013.01); *H01L 21/02433* (2013.01); *H01L 21/02458* (2013.01); *H01L 21/02516* (2013.01); *H01L 21/02609* (2013.01); *H01L 21/02625* (2013.01); *H01L 21/02628* (2013.01); *H01L 21/02634* (2013.01)

(56) References Cited

U.S. PATENT DOCUMENTS

| | | |
|---|---|---|
| 2007/0072320 A1 | 3/2007 | Frayssinet et al. |
| 2007/0296061 A1 | 12/2007 | Sasaki et al. |
| 2012/0074403 A1 | 3/2012 | Fujiwara et al. |
| 2012/0292737 A1* | 11/2012 | Kwak ............... H01L 29/417 257/506 |
| 2015/0203991 A1* | 7/2015 | Hashimoto ............. C30B 7/105 428/220 |
| 2016/0153120 A1* | 6/2016 | Hashimoto ........... C30B 29/406 428/220 |

FOREIGN PATENT DOCUMENTS

| | | |
|---|---|---|
| JP | 2009-519198 A | 5/2009 |
| JP | 4613933 B2 | 1/2011 |
| JP | 4622447 B2 | 2/2011 |
| JP | 2011-246304 A | 12/2011 |
| JP | 2012-006794 A | 1/2012 |
| JP | 2012-066983 A | 4/2012 |
| JP | 2014-055091 A | 3/2014 |
| JP | 5433374 B2 | 3/2014 |
| WO | WO 99/21217 A1 | 4/1999 |

OTHER PUBLICATIONS

Phy. Status Solidi C 10, No. 3, 400-404 (2013).
Jpn. J. Appl. Phys. 53, 2014, 05FA06 (2014).
Notification of Transmittal of Translation of the International Preliminary Report on Patentability (PCT/IB/338) in PCT Application No. PCT/JP2016/054743 dated Sep. 14, 2017 (and English translation of Written Opinion).

* cited by examiner

METHOD FOR MANUFACTURING GROUP-III NITRIDE SEMICONDUCTOR CRYSTAL SUBSTRATE

TECHNICAL FIELD

The present invention relates to a method for manufacturing a group III nitride semiconductor crystal substrate.

BACKGROUND ART

Group III nitride semiconductor crystals such as GaN are widely used to form optical devices such as light-emitting diode and laser, or high-frequency devices such as diode and transistor, and are expected to be used for power devices in the future.

Since many of these devices are obtained by epitaxial growth on a GaN substrate using the metal-organic vapor phase epitaxy (MOVPE) method, etc., characteristics of GaN substrate have a great impact even on device characteristics. Therefore, many studies to obtain high-quality GaN substrates have been actively conducted.

A method for manufacturing high-quality GaN substrate has been proposed, in which a GaN base substrate is formed by a liquid phase growth method such as the Na flux method and a thick GaN crystal is further grown thereon by the hydride vapor phase epitaxy (HYPE) method (see, e.g., PTLs 1 and 2).

In this method, since the liquid phase growth method characterized in less crystal defect occurrence and small variation in crystal orientation distribution due to warpage of crystal but low crystal growth rate is combined with the HYPE method characterized in more probability of defect occurrence but the high crystal growth rate, the two methods make up the respective shortcomings. Specific processes are disclosed in PTLs 1 and 2, etc.

Meanwhile, one of the methods capable of efficiently manufacturing a large high-quality Group III-V compound crystal with only few defects is a method for manufacturing a Group III-V compound crystal including a seed crystal-forming substrate providing step for providing a seed crystal-forming substrate (so-called point-seed substrate) having plural Group III-V compound seed crystals on a substrate, a contact step for bringing metal melt into contact with the surfaces of the plural Group III-V compound seed crystals, and a crystal growth step for forming and growing Group III-V compound crystals using the Group III-V compound seed crystals as nuclei by reacting a group III element with Group V element in the metal melt, wherein the plural Group III-V compound crystals grown from the plural Group III-V compound seed crystals are connected as their growth progresses in the crystal growth step, and a Group III-V compound layer formed on the substrate is partially removed by a physical process to form the plural Group III-V compound seed crystals (see PTL 3). Non-patent literatures 1 and 2 also disclose similar related techniques.

CITATION LIST

Patent Literature

[PTL 1]
JP-B-4622447
[PTL 2]
JP-B-4613933
[PTL 3]
JP-A-2014-055091

Non-Patent Literature

[NPTL 1]
M. Imanishi et al., "Coalescence growth of GaN crystals on point seed crystals using the Na flux method", Physica status solidi (c), Volume 10, Issue 3, March 2013, pages 400-404
[NPTL 2]
Mamoru Imade et al., "Growth of bulk GaN crystals by the Na-flux point seed technique", Jpn. J. Appl. Phys. 53, 2014, 05 FA06

SUMMARY OF INVENTION

Technical Problem

With the conventional techniques, when a thick group III nitride (e.g., GaN) crystal is grown by the HYPE method on a group III nitride (e.g., GaN) seed crystal substrate grown by a liquid phase growth method such as the Na flux method, a new dislocation(s) is sometimes formed in the grown crystal. In addition, since the group III nitride (e.g., GaN) crystal is thickly grown, the substrate is sometimes greatly warped concave with respect to the growth plane, and in severe cases, cracks occur in the crystal.

The frequency of occurrence and the magnitude of these phenomena are different for each lot of crystal growth and these phenomena also partially occur within a plane of the substrate, causing a great decrease in production yield of crystal. However, the mechanism of occurrence has not been revealed so far and any measure to address such problems has not been established.

It is an object of the invention to provide a method for manufacturing a group III nitride semiconductor crystal substrate by which it is possible to prevent new dislocation in a grown crystal, warpage of substrate and cracks in a crystal even when a thick group III nitride (e.g., GaN) crystal is grown by a vapor phase growth method such as the HYPE method on a group III nitride seed crystal substrate grown by a liquid phase growth method such as the Na flux method.

Solution to Problem

According to an embodiment of the invention, a method for manufacturing a group III nitride semiconductor crystal substrate defined by [1] to [14] below is provided.

[1] A method for manufacturing a group III nitride semiconductor crystal substrate, comprising: providing, as a seed crystal substrate, a group III nitride single crystal grown by a liquid phase growth method; and homoepitaxially growing a group III nitride single crystal by a vapor phase growth method on a principal surface of the seed crystal substrate, wherein the principal surface of the seed crystal substrate is a +c-plane, and wherein the seed crystal substrate has an atomic oxygen concentration of not more than $1 \times 10^{17}$ cm$^{-3}$ in a crystal near the principal surface over an entire in-plane region thereof.

[2] The method for manufacturing a group III nitride semiconductor crystal substrate according to [1], wherein the group III nitride single crystal grown on the seed crystal substrate by the vapor phase growth method has an atomic oxygen concentration of not more than $1 \times 10^{17}$ cm$^{-3}$ in the crystal.

[3] The method for manufacturing a group III nitride semiconductor crystal substrate according to [1] or [2], wherein the seed crystal substrate comprises, at least on the principal surface, a crystalline region grown in a state that a flat growth interface in two-dimensional growth mode is maintained during crystal growth.

[4] The method for manufacturing a group III nitride semiconductor crystal substrate according to [1] or [2], wherein the seed crystal substrate comprises a crystal that is grown while gradually transitioning a shape of a growth interface during crystal growth, from an uneven growth interface in three-dimensional growth mode to a flat growth interface in two-dimensional growth mode.

[5] The method for manufacturing a group III nitride semiconductor crystal substrate according to any one of [1] to [4], wherein at least the principal surface of the seed crystal substrate is mirror-polished.

[6] The method for manufacturing a group III nitride semiconductor crystal substrate according to any one of [1] to [5], wherein an average dislocation density on the surface of the seed crystal substrate is not more than $1 \times 10^7$ cm$^{-2}$.

[7] The method for manufacturing a group III nitride semiconductor crystal substrate according to any one of [1] to [6], wherein a c-plane of the seed crystal substrate has inside the crystal a warpage that is concave surface-shaped toward the principal surface.

[8] The method for manufacturing a group III nitride semiconductor crystal substrate according to [7], wherein the seed crystal substrate has a diameter of not less than 50 mm, and
wherein the c-plane thereof has inside the crystal a warpage that is concave surface-shaped toward the principal surface and not less than 5 m in curvature radius.

[9] The method for manufacturing a group III nitride semiconductor crystal substrate according to any one of [1] to [8], wherein the liquid phase growth method is a flux method.

[10] The method for manufacturing a group III nitride semiconductor crystal substrate according to any one of [1] to [9], wherein the vapor phase growth method is an HYPE method, and
wherein the group III nitride single crystal having a larger thickness than the seed crystal substrate is homoepitaxially grown on the seed crystal substrate by the HYPE method.

[11] The method for manufacturing a group III nitride semiconductor crystal substrate according to any one of [1] to [10], wherein the seed crystal substrate is made using as a starting substrate a seed crystal-forming substrate (or a point-seed substrate) with a plurality of group III nitride seed crystals formed thereon.

[12] The method for manufacturing a group III nitride semiconductor crystal substrate according to any one of [1] to [11], wherein no polarity-reversal region is not present at least on the principal surface of the seed crystal substrate.

[13] The method for manufacturing a group III nitride semiconductor crystal substrate according to any one of [1] to [12], wherein at least one or more group III nitride single crystal free-standing substrates are made from the group III nitride single crystal grown by the vapor phase growth method.

[14] The method for manufacturing a group III nitride semiconductor crystal substrate according to any one of [1] to [13], wherein the group III nitride comprises GaN.

As a result of intense research and study to find the mechanism of occurrence of dislocation defect or warpage when a thick GaN crystal is epitaxially grown by a vapor phase growth method such as the HYPE method on a group III nitride (e.g., GaN) substrate (GaN is described as an example in the following description) formed by a liquid phase growth method such as the Na flux method, the present inventors found that a slight lattice mismatch sometimes occurs between the GaN crystal grown by the liquid phase growth method and the GaN crystal grown by the vapor phase growth method and it is caused by a difference in the incorporated amount of impurity elements, particularly oxygen, which depends on the growth mode when growing GaN crystal by the liquid phase growth method.

The Na flux method is a crystal growth method by which a relatively high-purity GaN crystal can be grown, but oxygen is exceptional and is likely to be incorporated into the GaN crystal. The amount of oxygen incorporated into GaN crystal depends on purities of an atmosphere or components inside a crystal growth furnace and crystal growth conditions, and oxygen incorporated into GaN crystal can be as many as the nineteenth power cm$^{-3}$.

When a large amount of oxygen is incorporated into GaN crystal, a lattice of this GaN crystal is stretched in a direction perpendicular to the c-axis, and a GaN crystal grown thereon by the HYPE method has a lattice mismatch of not less than 0.01%. It was found that this lattice mismatch causes a strain to be induced, dislocations to be formed, substrate to be warped concave in a growth direction, and in an excessive case, cracks to occur, in a GaN crystal grown by the HYPE method.

During growth of GaN crystal by the Na flux method, oxygen is likely to be incorporated into the GaN crystal when GaN crystal is grown in a state that the crystal growth interface is not flat, i.e., a non-c-plane emerges at the growth interface in case of growth in the c-axis direction. It was found that a concentration of oxygen incorporated into the crystal grown on a non-c-plane is astonishingly 100 times higher than in a crystal grown on a c-plane.

Use of the Na flux method to grow GaN crystal is advantageous because it is easy to grow GaN crystals with low dislocation density. Base substrates to be used for crystal growth by the Na flux method thus also need to have a low dislocation density, but it is generally difficult to obtain such substrates. Therefore, base substrates having a limited number of nucleation sites commonly used in, e.g., ELO (Epitaxial Lateral Overgrowth) method or the method described in PTL 3 or NPTL 1 or 2 (so-called point-seed technique), etc., are used.

When a GaN crystal is grown on a base substrate having a limited number of nucleation sites, a nucleus of GaN crystal is firstly formed at each nucleation site, each of the crystal nuclei then grows large, and plural islands are thereby formed. This state is called three-dimensional island growth mode. After that, GaN islands grow larger and adjacent islands are connected into a continuous GaN film. At this time, depending on the crystal growth conditions, the three-dimensional growth mode, in which the growth interface still has a raised and recessed pattern derived from the shape of the islands and a non-c-plane emerges, sometimes continues or sometimes transitions to the two-dimensional growth mode in which the growth interface becomes gradually flat and growth occurs on a c-plane.

Base substrates having a limited number of nucleation sites are often used as seed crystal substrates in the flux method because it is known that in the three-dimensional growth mode, dislocations transferred from the base substrate or dislocations formed at an interface between the base substrate and initial growth nuclei are curved in travel direction the process of propagating as "grown-in" in the crystal and are less likely to reach the top surface, and this effect enables to grow a GaN crystal with a very low dislocation density. For this reason, crystal growth in the initial stage is intentionally performed in the three-dimensional growth mode.

On the other hand, GaN grown in the three-dimensional growth mode tends to have a high oxygen concentration in the crystal, as described above. However, it has not been known how the oxygen in crystal affects a GaN crystal subsequently grown by the HYPE method, and crystal growth control focusing on oxygen distribution in crystal thus has not been performed. In other words, a GaN substrate formed by the flux method has a mixture of crystal grown only in the three-dimensional growth mode, crystal grown on an interface partially transitioned to the two-dimensional growth mode and crystal grown only in the two-dimensional growth mode. In addition, since the crystal grown only in the two-dimensional growth mode is not sufficiently thick, the crystalline region grown in the two-dimensional growth mode is often totally removed by the subsequent polishing process, resulting in that the crystalline region grown in three-dimensional growth mode emerges on the substrate surface.

Growth of GaN crystal on a GaN substrate formed by the flux method has been reported in some cases, but is mainly thin-film growth using the MOCVD method. When a crystal to be grown is a thin film having a thickness of up to several tens μm, the crystal grows while a crystal lattice is distorted due to elastic deformation, and problems such as dislocation, warpage or crack do not occur in many cases. However, when growing a thick film of several hundred μm to obtain a GaN substrate, strain cannot be accumulated inside the crystal and the problems mentioned above occur.

However, when a thick crystal film of more than several hundred μm contains many crystal defects, i.e., when a crystal is grown so as to have a high density of dislocations or a defect concentration region, such defects serve as a strain release end and the this prevents the problems described above. The above-described phenomena are findings discovered only after successfully growing a high-quality thick GaN crystal.

The present invention was made based on such findings.

Advantageous Effects of Invention

According to one embodiment of the invention, it is possible to provide a method for manufacturing a group III nitride semiconductor crystal substrate by which it is possible to prevent new dislocation in a grown crystal, warpage of substrate and cracks in a crystal even when a thick group III nitride (e.g., GaN) crystal is grown by a vapor phase growth method such as the HYPE method on a group III nitride seed crystal substrate grown by a liquid phase growth method such as the Na flux method.

DESCRIPTION OF EMBODIMENT

Figure 1A:
FIG. 1A is a schematic cross-sectional view showing a step in a process of manufacturing a seed crystal substrate in an embodiment of the present invention, using the Na flux method to grow a GaN single crystal.
Figure 1B:
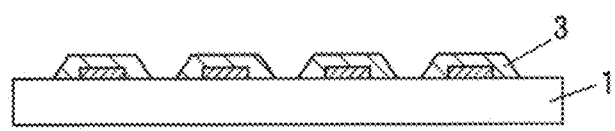
FIG. 1B is a schematic cross-sectional view showing another step in the process of manufacturing the seed crystal substrate in the embodiment of the invention.
Figure 1C:
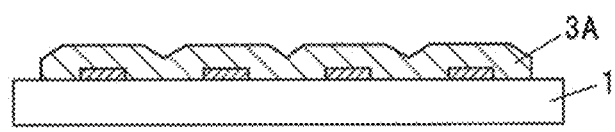
FIG. 1C is a schematic cross-sectional view showing another step in the process of manufacturing the seed crystal substrate in the embodiment of the invention.
Figure 1D:
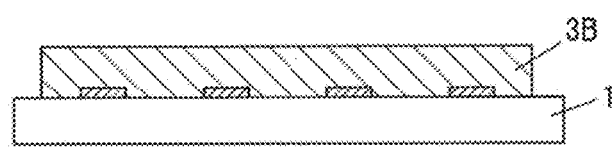
FIG. 1D is a schematic cross-sectional view showing another step in the process of manufacturing the seed crystal substrate in the embodiment of the invention.

A method for manufacturing a group III nitride semiconductor crystal substrate in the embodiment of the invention is a method in which a group III nitride single crystal grown by a liquid phase growth method is used as a seed crystal substrate and another group III nitride single crystal is homoepitaxially grown on a principal surface of the seed crystal substrate by a vapor phase growth method, and the manufacturing method is characterized in that the principal surface of the seed crystal substrate is a +c-plane and the atomic oxygen concentration in the crystal in the vicinity of the principal surface of the seed crystal substrate is not more than $1 \times 10^{17}$ cm$^{-3}$ throughout the in-plane area thereof. The oxygen atom concentration of not more than $1 \times 10^{17}$ cm$^{-3}$ is a concentration at which an impact of lattice strain caused by oxygen atoms is ignorable when GaN is grown thick (e.g., not less than 500 µm).

In the present embodiment, the "principal surface" means the widest of surfaces present on a crystal, and the "principal surface" of the seed crystal substrate is generally a surface on which a crystal is grown. In addition, in the present embodiment, the "c-plane" is a {0001} plane in the hexagonal crystal structure (Wurtzite crystal structure) and is a plane orthogonal to the c-axis. This plane is a polar face, and the "+c-plane" of group III nitride semiconductor crystal is a group III metal face (a gallium face in case of gallium nitride). In addition, in the present embodiment, when the oxygen atom concentration is measured at plural given locations on the substrate surface, e.g., at the center of the substrate surface, two to three points on a concentric circle at a distance of 5 to 10 mm from the center, and two to three points on another concentric circle at a distance of 15 to 20 mm (in detail, for example, the center of the substrate surface and points at distances of 10 mm and 20 mm on right and left from the center, i.e., five points in total, as is in Example described later), it is regarded as measurement "throughout the in-plane area". In addition, in the present embodiment, "the vicinity of the principal surface" means a region within 20 µm in depth from the principal surface.

In the embodiment of the invention, in addition to the atomic oxygen concentration in the crystal in the vicinity of the principal surface of the seed crystal substrate, the atomic oxygen concentration in the group III nitride single crystal grown on the seed crystal substrate by the vapor phase growth method is desirably also not more than $1 \times 10^{17}$ cm$^{-3}$. The lattice strain on the substrate side can be reduced to an ignorable level when the oxygen concentration in GaN crystal is not more than $1 \times 10^{17}$ cm$^{-3}$, but it is meaningless if the oxygen concentration on the grown crystal side is high. Although strains can be cancelled out when the concentration is the same on the both sides, it is desirable that the concentration be not more than $1 \times 10^{17}$ cm$^{-3}$ on the both sides so as to be accurately controlled.

In addition, the GaN seed crystal substrate grown by a liquid phase growth method such as the flux method (the flux method is described as an example in the following description) is desirably formed so that a crystalline region of at least the principal surface is a crystalline region grown only in the two-dimensional growth mode in which the growth interface is kept flat during crystal growth. Furthermore, the GaN seed crystal substrate grown by the flux method is desirably formed of a crystal which is grown while gradually transitioning, during the crystal growth thereof, from the three-dimensional growth mode with an uneven growth interface to the two-dimensional growth mode with a flat growth interface. When the crystalline region of the principal surface is formed of a crystalline region grown while maintaining the two-dimensional growth mode with a flat growth interface, it is effective to reduce the concentration of oxygen incorporated into the GaN crystal. Another method to reduce the oxygen concentration in the GaN crystal could be to keep a very low concentration of oxygen or water mixed in a flux furnace, but this is not very realistic when considering purities of raw materials and a transferring process into and from the furnace. The reason of performing the three-dimensional growth mode at the initial stage of crystal growth is that an effect of reducing dislocation defects can be expected as previously described.

The seed crystal substrate may be formed such that at least the principal surface is mirror-polished. When level differences or warpage are observed in the surface morphology of the as-grown GaN crystal especially when grown by the flux method, the surface is desirably mirror-polished to be flat. In this case, it is important that processing strain does not remain on the polished surface.

In addition, the average dislocation density on the surface of the GaN seed crystal substrate grown by the flux method is desirably not more than $1 \times 10^7$ cm$^{-2}$. Furthermore, the GaN seed crystal substrate desirably does not have a polarity-reversal region at least on the principal surface. The present invention is a method suitable for manufacturing a GaN crystal with a small amount of defects as previously described. To obtain the effects of the invention, the dislocation density in a crystal grown by a vapor phase growth method such as the HYPE method is desirably not more than $1 \times 10^7$ cm$^{-2}$. To achieve this dislocation density, the average dislocation density on the surface of the seed crystal substrate grown by the flux method is desirably also not more than $1 \times 10^7$ cm$^{-2}$. In the embodiment of the invention, "average dislocation density" means an average of dislocation density measured at plural given locations on the substrate surface, e.g., at the center of the substrate surface, two to three points on a concentric circle at a distance of 5 to 10 mm from the center, and two to three points on another concentric circle at a distance of 15 to 20 mm (in detail, for example, the center of the substrate surface and points at distances of 10 mm and 20 mm on right and left from the center, i.e., five points in total, as is in Example described later). The polarity-reversal region means a microscopic region of an N-polar face with reversed polarity partially emerged on a Ga-polar face of the principal surface. When a polarity-reversal region is present in the seed crystal and epitaxial growth is performed thereon, there is a problem that morphology abnormalities such as pits appear above the polarity-reversal region. The presence of the polarity-reversal region can be detected by the CBED (convergent beam electron diffraction) technique, and can be detected more easily using an etching rate difference from a normal region and by performing, e.g., etching in molten alkali.

In addition, in the present embodiment of the invention, it is desirable that the c-plane of the seed crystal substrate be not curved inside the crystal. However, in case of having a curve, the curve inside the crystal is desirably concave with respect to the principal surface. Further desirably, the diameter of the seed crystal substrate is not less than 50 mm and the c-plane thereof is curved inside the crystal and is concave, with a radius of curvature of not less than 5 m, with respect to the principal surface. When the c-plane of the seed crystal substrate is curved inside the crystal and is convex with respect to the principal surface, tensile strain occurs in a GaN crystal grown thereon and a concave curve occurs in an opposite way to release strain when a thick crystal is grown, which increases a risk of cracking. This tendency is more remarkable for a grown crystal with a larger diameter, and when the diameter of the seed crystal substrate is not less than 50 mm, probability of occurrence of cracks is high unless the radius of curvature of the curve of the c-plane is not less than 5 m.

In addition, in the embodiment of the invention, the liquid phase growth method is desirably the flux method. To grow a GaN crystal, it is suitable to use so-called Na flux method in which metallic sodium (Na) is used as a base material of melt.

In addition, in the embodiment of the invention, desirably, the vapor phase growth method is the HYPE method and a GaN single crystal is homoepitaxially grown by the HYPE method so as to be thicker than the seed crystal substrate. The object of the invention is to grow GaN by a vapor phase growth method and to use a crystalline region thereof as a high-quality GaN substrate, and the effects of the invention are efficiently exerted when growing a thick GaN crystal by the vapor phase growth method. Therefore, it is desirable to grow a GaN crystal to be thicker than at least the seed crystal substrate, in detail, to have a thickness of not less than 500 μm.

In addition, in the embodiment of the invention, a seed crystal-forming substrate having plural group III nitride seed crystals on a substrate, so-called point-seed substrate described in PTL 3 and PTLs 1 and 2, may be used as a starting substrate to form the seed crystal substrate. By using the point-seed substrate as a starting substrate, it is possible to grow a low-dislocation-density GaN crystal substrate with well reproducibility.

In the method for manufacturing a GaN single crystal substrate in the embodiment of the invention, it is possible to form at least one or more GaN single crystal free-standing substrates from a GaN single crystal layer grown by the above-mentioned vapor phase growth method. To form GaN single crystal free-standing substrate(s) from a GaN single crystal layer grown by the vapor phase growth method, a method in which the seed crystal substrate is removed by grinding or polishing can be used to form only a single substrate, while a method in which substrates are cut out by a wire saw or a wire electric discharge machine, etc., is desirably used to obtain plural substrates. By polishing the front and back surfaces of the cut substrates, substrates suitable for forming GaN devices are obtained.

Next, an embodiment of the conventional technique will be described for the purpose of comparison with the embodiment of the invention.

Figure 8A:
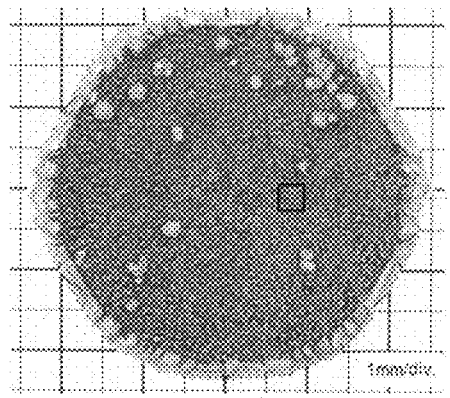
FIG. 8A is an overview photograph showing a GaN crystal grown on an uneven plane as a growth interface in Prior Art Example.
Figure 9A:
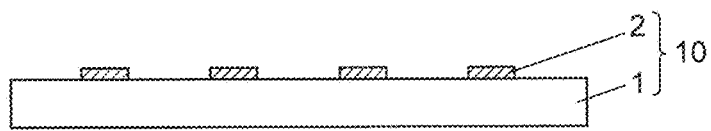
FIG. 9A is a schematic cross-sectional view showing a step in a process of manufacturing a seed crystal substrate in the conventional technique, using the Na flux method to grow a GaN single crystal.
Figure 9B:
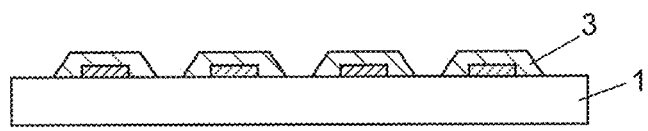
FIG. 9B is a schematic cross-sectional view showing another step in the process of manufacturing the seed crystal substrate in the conventional technique.
Figure 9C:
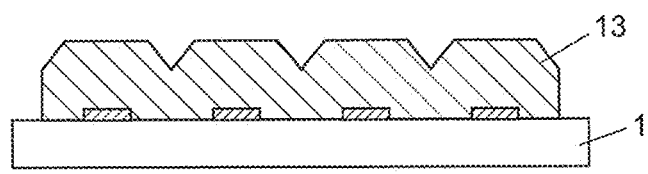
FIG. 9C is a schematic cross-sectional view showing another step in the process of manufacturing the seed crystal substrate in the conventional technique.
Figure 9D:
FIG. 9D is a schematic cross-sectional view showing another step in the process of manufacturing the seed crystal substrate in the conventional technique.
Figure 9E:
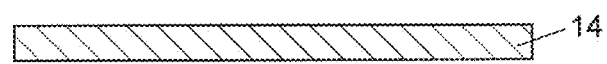
FIG. 9E is a schematic cross-sectional view showing another step in the process of manufacturing the seed crystal substrate in the conventional technique.

FIGS. 9A to 9E are schematic cross-sectional views showing a process of manufacturing a seed crystal substrate in the conventional technique, using the Na flux method to grow a GaN single crystal. A seed crystal substrate for the flux method used in this example is a substrate 10 in which plural GaN crystals (point seeds) 2 having a c-plane (Ga-face) on a surface are preliminary arranged on a base substrate 1 (FIG. 9A). This seed crystal substrate 10 for the flux method is bought into contact with a Ga-containing alkali metal melt as a flux in a nitrogen-containing atmosphere so that GaN crystals are formed by reaction of a Ga element with nitrogen in the alkali metal melt, thereby growing GaN crystals 3 on the point seeds 2 (FIG. 9B). The GaN crystals 3 growing on the point seeds 2 are initially separate island crystals each having a hexagonal pyramid shape, the island crystals become larger as the growth progresses, and adjacent crystals are connected to each other and formed into a continuous film-shaped GaN single crystal 13 (FIG. 9C). Even after the continuous film-shaped GaN single crystal 13 is formed by connection between adjacent GaN crystals, crystal growth advances while unevenness derived from the island crystals remains generally on a surface (crystal growth interface) and the thickness of the continuous film-shaped GaN single crystal 13 keeps increasing. Since the crystal growth rate in the flux method is as very low as about 10 μm/h, growth is generally terminated once the crystal is grown to a thickness at which the grown crystal has sufficient strength as a free-standing substrate (about 300 to 400 μm), and the crystal is taken out. Since not enough time is taken to continuously grow the crystal in a state that the c-plane is exposed, a crystal grown on an uneven crystal growth interface as shown in FIG. 8A is obtained. The GaN single crystal 13 taken out of the flux after the termination of the growth spontaneously (naturally) separates from the base substrate 1 and a GaN single crystal free-standing substrate 13 is obtained (FIG. 9D). By shaping the circumference and polishing the front and back surfaces, a GaN free-standing single crystal substrate 14 for epitaxial growth is obtained (FIG. 9E).

Oxygen as an impurity is incorporated into the GaN crystal grown by the flux method as previously mentioned, and the incorporated amount greatly varies depending on the plane orientation of the growth interface of the crystal. That is, the oxygen concentration is at the seventeenth power $cm^{-3}$ when growing a crystal on a c-plane (Ga-face) but jumps to the nineteenth power $cm^{-3}$ when growing on a non-c-plane. Thus, as for a crystal grown on an uneven growth interface, a region corresponding to the growth history of the uneven surface is likely to be at a higher oxygen concentration than a region corresponding to the growth history of a crystal grown on the c-plane. This state is schematically shown in FIGS. 10A to 10C.

Figure 10A:
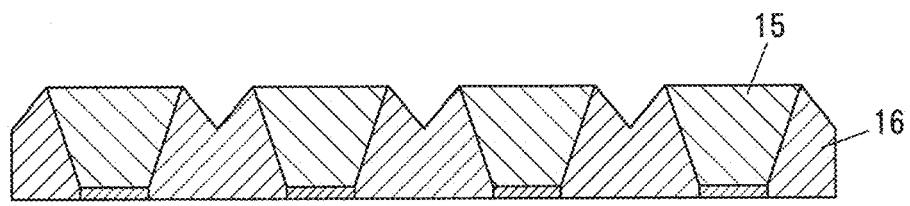
FIG. 10A is a schematic cross-sectional view showing an example of distribution of high-oxygen-concentration region in an as-grown GaN crystal grown by the Na flux method in the conventional technique.
Figure 10B:
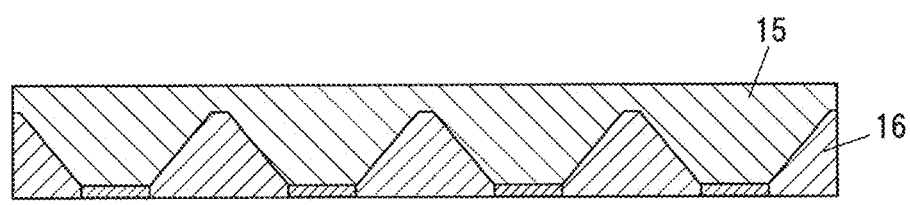
FIG. 10B is a schematic cross-sectional view showing another example of distribution of high-oxygen-concentration region in the as-grown GaN crystal grown by the Na flux method in the conventional technique.
Figure 10C:
FIG. 10C is a schematic cross-sectional view showing distribution of high-oxygen-concentration region in a GaN crystal substrate grown by the Na flux method in the conventional technique.

FIG. 10A is a schematic cross-sectional view showing an example of distribution of high-oxygen-concentration region in an as-grown GaN crystal grown by the Na flux method in the conventional technique, FIG. 10B is a schematic cross-sectional view showing another example of distribution of high-oxygen-concentration region in the as-grown GaN crystal grown by the Na flux method in the conventional technique, and FIG. 10C is a schematic cross-sectional view showing distribution of high-oxygen-concentration region in a GaN crystal substrate grown by the Na flux method in the conventional technique.

Since a crystal is grown in the state that the region at which the island crystals 3 are connected remains as a recess on the growth interface, a high-oxygen-concentration region 16 as a region with the crystal grown on the concave plane is mixed with a low-oxygen-concentration region 15 grown on the c-plane. Depending on the degree of unevenness of the crystal growth interface, a ratio of the high-oxygen-concentration region 16 to the low-oxygen-concentration region 15 varies, and in some cases, the obtained crystal is mostly formed of the high-oxygen-concentration region 16. In addition, even if a flat-c-plane ultimately appears on the crystal growth interface, there is a case where the-oxygen-concentration region 15 is uniformly present only in the vicinity of the surface of the crystal and the high-oxygen-concentration region 16 is buried inside the crystal in a wide area as schematically shown in FIG. 10B when duration of growth on the uneven growth interface is long before the flat c-plane emerges. When a crystal as shown in FIG. 10A or 10B is polished after removing front and back surfaces to form a GaN single crystal substrate, the obtained GaN single crystal substrate has good appearance but contains the high-oxygen-concentration region 16 therein as schematically shown in FIG. 10C, resulting in that the substrate has large variation in crystal lattice constant. The high-oxygen-concentration region 16 in the crystal can be detected by observing the light-emitting state of the crystal under exposure to UV radiation. That is, while a region with a low oxygen concentration emits bright luminescent light, a region with a high oxygen concentration emits weak light and can be clearly distinguished since dark shadow creates contrast. To find a specific level of oxygen concentration, a location found in the above-mentioned observation is analyzed by SIMS.

Figure 11:
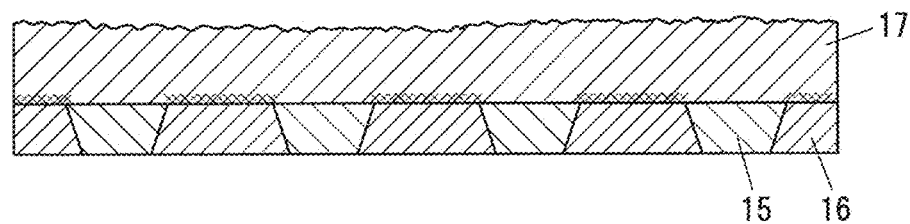
FIG. 11 is a schematic cross-sectional view showing defect occurrence in the conventional technique when a thick GaN crystal is homoepitaxially grown by the HYPE method on a GaN crystal substrate grown by the Na flux method.

When such GaN substrate containing the high-oxygen-concentration region 16 is used as a seed crystal and a thick GaN film 17 is homoepitaxially grown thereon by the HYPE method, the HYPE-grown crystal typically has an oxygen concentration of about the seventeenth power $cm^{-3}$ and thus has a different lattice constant from that of the high-oxygen-concentration region 16 contained in the seed crystal, hence, a strain occurs in the crystal lattice. This state is shown as a schematic image in FIG. 11. FIG. 11 is a schematic cross-sectional view showing defect occurrence in the conventional technique when a thick GaN crystal is homoepitaxially grown by the HYPE method on a GaN crystal substrate grown by the Na flux method. Since a GaN crystal lattice incorporating oxygen has been slightly stretched, a crystal to be grown thereon starts its growth with a lattice distorted in the extended shape. However, stress to return to the original lattice constant of GaN crystal is generated as the crystal becomes thicker. Then, the crystal as a whole is curved concave in the growth direction, and if the crystal cannot withstand elastic deformation, dislocations or cracks occur in the crystal. Crystals having dislocations caused by lattice mismatch often have rough surface morphology and do not exhibit high crystallinity in the evaluation by X-ray diffraction. With the conventional technique, even when crystal growth is performed using a combination of the flux method and the HYPE method with great efforts, a crystal with a good crystallinity is only partially obtained from a portion in which a wide c-plane growth region is present by chance, and it is extremely difficult to obtain a high-grade crystal throughout the substrate surface.

Next, the embodiment of the invention will be described.

Figure 1E:
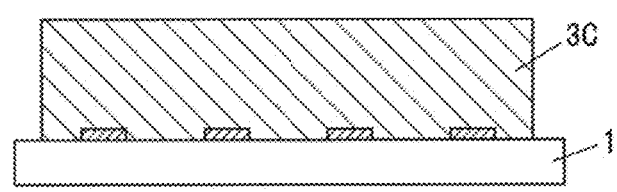
FIG. 1E is a schematic cross-sectional view showing another step in the process of manufacturing the seed crystal substrate in the embodiment of the invention.
Figure 1F:
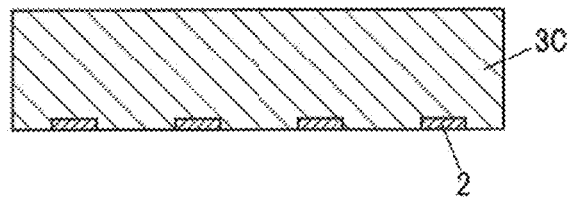
FIG. 1F is a schematic cross-sectional view showing another step in the process of manufacturing the seed crystal substrate in the embodiment of the invention.
Figure 1G:
FIG. 1G is a schematic cross-sectional view showing another step in the process of manufacturing the seed crystal substrate in the embodiment of the invention.

FIGS. 1A to 1G are schematic cross-sectional views showing a process of manufacturing a seed crystal substrate in the embodiment of the invention, using the Na flux method to grow a GaN single crystal. A substrate formed by arranging the point seeds 2 on the base substrate 1 is used as the seed crystal substrate 10 and a GaN crystal is grown by the flux method (FIGS. 1A and 1B) in the same manner as the conventional technique, but the embodiment of the invention is different from the conventional technique in that a lateral growth rate of the crystals 3 is enhanced by controlling the crystal growth conditions in the flux method to have a flat c-plane at a solid-liquid interface in the early stage (a GaN single crystal 3A→a GaN single crystal 3B in FIGS. 1C and 1D), and the crystal is grown thick while keeping the flat interface shape (FIG. 1E). More specifically, in order to have a flat c-plane at the solid-liquid interface by controlling the lateral growth rate of the crystal, the conditions are adjusted such that nitrogen supply to recesses on the bonding interface is increased during crystal growth, or point seeds are arranged with a smaller pitch. In this technique, considering a subsequent polishing process performed on the front surface of the substrate, it is important to grow a thick crystal while keeping the flat interface shape so that a sufficient c-plane growth region is left even after partially removing the surface of the crystal by polishing. A GaN single crystal 3C taken out of the flux after the termination of the growth spontaneously (naturally) separates from the base substrate 1 and a GaN single crystal free-standing substrate 3C is obtained (FIG. 1F) in the same manner as the conventional technique. Then, by shaping the circumference and polishing the front and back surfaces, a GaN free-standing single crystal substrate 14 for epitaxial growth is obtained (FIG. 1G).

Figure 2A:
FIG. 2A is a schematic cross-sectional view showing distribution of high-oxygen-concentration region in an as-grown GaN crystal grown by the Na flux method in the embodiment of the invention.
Figure 2B:
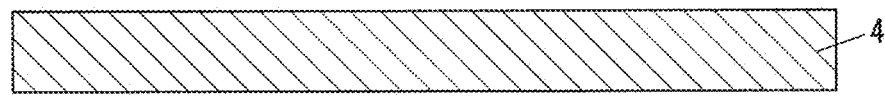
FIG. 2B is a schematic cross-sectional view showing an example of distribution of high-oxygen-concentration region in a GaN crystal substrate grown by the Na flux method in the embodiment of the invention.

FIG. 2A is a schematic cross-sectional view showing distribution of high-oxygen-concentration region in an as-grown GaN crystal grown by the Na flux method in the embodiment of the invention, and FIG. 2B is a schematic cross-sectional view showing an example of distribution of high-oxygen-concentration region in a GaN crystal substrate grown by the Na flux method in the embodiment of the invention. This crystal also has a high-oxygen-concentration region 6 in the vicinity of the back surface since crystal growth advances in the three-dimensional island growth mode at the initial stage of growth. However, the high-oxygen-concentration region 6 is present only on the back surface side of the substrate since the solid-liquid interface is flattened in the early stage, and a low-oxygen-concentration region 5 uniformly spreads from the middle stage of crystal growth onwards. By polishing the front and back surfaces of this crystal, the high-oxygen-concentration region 6 is completely removed and a GaN single crystal substrate 4 with a low and uniform oxygen concentration is obtained, as shown in FIG. 2B.

Figure 3:
FIG. 3 is a schematic cross-sectional view showing another example of distribution of high-oxygen-concentration region in a GaN crystal substrate grown by the Na flux method in the embodiment of the invention.

Meanwhile, FIG. 3 is a schematic cross-sectional view showing another example of distribution of high-oxygen-concentration region in a GaN crystal substrate grown by the Na flux method in the embodiment of the invention. Even when the removed amount is not enough and the high-oxygen-concentration region 6 is partially left on the back surface side of the substrate as shown in FIG. 3, no problem arises as long as the low-oxygen-concentration region 5 with a sufficient thickness spreads uniformly on the front surface side.

In case of crystal growth on the GaN single crystal substrate 4 obtained as described above, strain or dislocation due to lattice mismatch does not occur even when a thick GaN crystal is homoepitaxially grown by the HYPE method, and a good-quality GaN crystal thus can be grown.

Figure 4A:
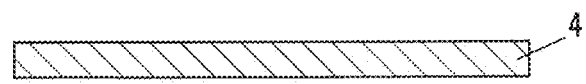
FIG. 4A is a schematic cross-sectional view showing a step in a process of obtaining plural GaN substrates from a grown crystal in the embodiment of the invention, where the grown crystal is a thick GaN single crystal homoepitaxially grown by the HYPE method on a seed crystal substrate grown by the Na flux method.
Figure 4B:
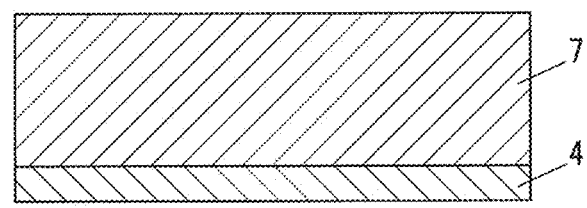
FIG. 4B is a schematic cross-sectional view showing another step in the process of obtaining plural GaN substrates from the grown crystal in the embodiment of the invention.
Figure 4C:
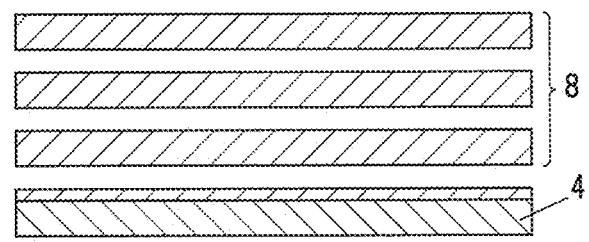
FIG. 4C is a schematic cross-sectional view showing another step in the process of obtaining plural GaN substrates from the grown crystal in the embodiment of the invention.

FIGS. 4A to 4C are schematic cross-sectional views showing a process of obtaining plural GaN substrates from a grown crystal in the embodiment of the invention, where the grown crystal is a thick GaN single crystal homoepitaxially grown by the HYPE method on a seed crystal substrate grown by the Na flux method (FIG. 4A is the same as FIG. 1G). After obtaining the GaN seed crystal substrate (FIG. 4A), a thick GaN single crystal 7 is grown thereon by the HYPE method (FIG. 4B), and plural GaN substrates 8 are cut out of the HYPE-grown crystal 7. An existing slicing technique such as inner peripheral blade slicer, peripheral cutting edge slicer, wire saw or a wire electric discharge machine is directly applicable as a means for slicing the crystal.

Other Embodiments of the Invention

Although GaN has been described as an example of group III nitride ($In_xAl_yGa_zN$, where $0 \leq x \leq 1$, $0 \leq y \leq 1$, $0 \leq z \leq 1$ and $x+y+z \leq 1$) in the above-described embodiment, the invention is applicable to a group III nitride crystal other than GaN, e.g., applicable to AlN, AlGaN, InGaN, AlInGaN and a crystal laminated structure thereof, etc.

In addition, although a technique of manufacturing a c-plane (Ga-face) GaN crystal substrate has been described as an example in the embodiment, the invention is effective also when growth orientation has an off-angle.

In addition, even in case that the growth orientation is other than the c-plane, the invention can be effectively applied when the concentration of the incorporated impurity is different between a portion grown on the principal surface and a portion grown on other uneven surface.

Effects of the Embodiment

According to the embodiment of the invention, it is possible to provide a method for manufacturing a group III nitride semiconductor crystal substrate by which it is possible to prevent new dislocation in a grown crystal, warpage of substrate and cracks in a crystal even when a thick group III nitride (e.g., GaN) crystal is grown by a vapor phase growth method such as the HYPE method on a group III nitride seed crystal substrate grown by a liquid phase growth method such as the Na flux method.

In addition, according to the embodiment of the invention, a high-quality GaN substrate having a low dislocation density and small variation in in-plane crystal orientation of the substrate can be efficiently manufactured using equipment equivalent to that of the conventional technique. Particularly, residual strain in a crystal grown by a vapor phase growth method such as the HYPE method is reduced. Therefore, conventional problems in forming of a large-diameter GaN single crystal substrate, such as occurrence of cracks during processing a crystal, are also solved and it is possible to manufacture such substrates with a good yield.

The invention will be described in more detail below in reference to Example. However, the invention is not limited thereto.

Example

Firstly, an apparatus used for growing a GaN crystal by a liquid phase growth (the flux method) will be described.

Figure 5:
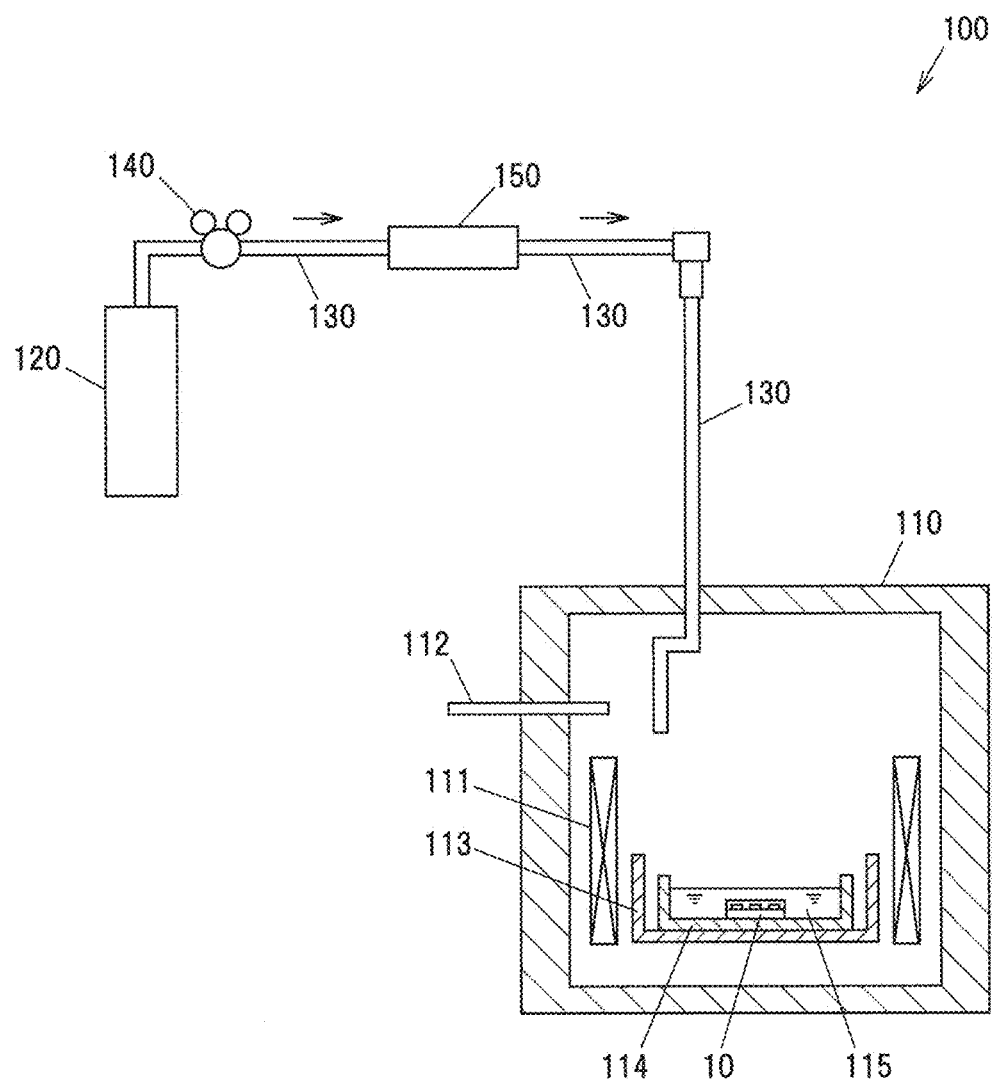
FIG. 5 is a schematic explanatory diagram illustrating a crystal growth apparatus designed to use the Na flux method and used in the manufacturing method in the embodiment of the invention.

FIG. 5 is a schematic explanatory diagram illustrating a crystal growth apparatus designed to use the Na flux method and used in the manufacturing method in the embodiment of the invention.

As shown in the drawing, a Na flux crystal growth apparatus 100 is provided with a stainless steel growth furnace 110 and a source gas tank 120, and the growth furnace 110 and the source gas tank 120 are coupled by a pipe 130. A pressure regulator (adjuster) 140 and a flow rate regulator (adjuster) 150 are attached to the pipe 130 between the growth furnace 110 and the source gas tank 120. The growth furnace 110 accommodates a heater 111 for heating and a thermocouple 112 and is configured to withstand atmospheric pressure of 50 atm ($50 \times 1.013 \times 10^5$ Pa). A crucible fixing base 113 is also arranged in the growth furnace 110. A crucible 114 formed of aluminum oxide ($Al_2O_3$) is fixed inside the crucible fixing base 113, and a melt 115 and the seed crystal substrate 10 for the flux method are placed inside the crucible 114. In this state, a nitrogen gas or a mixture of ammonia gas ($NH_3$ gas) and nitrogen gas, as a source gas, is supplied from the source gas tank 120 through the pipe 130 in an arrow direction in the drawing (atmosphere gas feeding direction) to perform a reaction (crystal growth). The source gas (atmosphere gas) is sent to the growth furnace 110 after impurities are removed by a gas purification unit (not shown). Meanwhile, pressure of the source gas (pressure of the atmosphere) is adjusted by the pressure regulator 140 and the flow rate regulator 150.

Next, an apparatus used for growing a GaN crystal by a vapor phase growth (the HYPE method) will be described.

Figure 6:
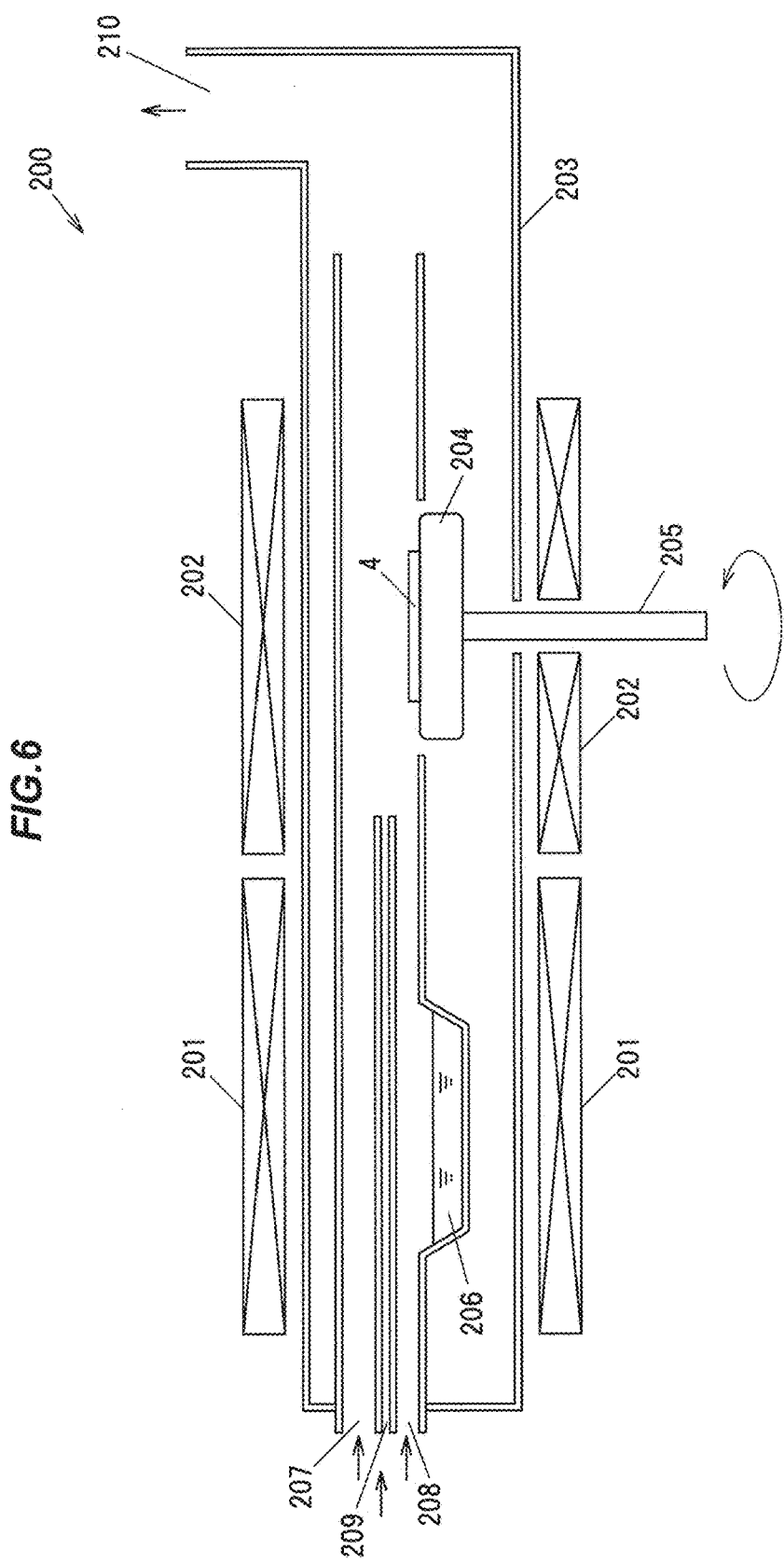
FIG. 6 is a schematic cross-sectional view showing a crystal growth apparatus designed to use the HYPE method and used in the manufacturing method in the embodiment of the invention.

FIG. 6 is a schematic cross-sectional view showing a crystal growth apparatus designed to use the HYPE method and used in the manufacturing method in the embodiment of the invention.

A HYPE crystal growth apparatus (HYPE furnace) 200 is configured that a quartz reaction tube 203 is inserted into a heater having two zones; a raw material heating heater 201 heated to about 800° C. and a crystal growth region heating heater 202 heated to about 1000° C. Source gas introducing pipe are provided on the upstream side of the reaction tube 203. An ammonia gas as a group-V source is introduced into a furnace through an ammonia gas introducing pipe 207. Metal gallium 206 as a group III source contained in a quartz boat is placed in a region heated by the gallium source heating heater 201. Through a quartz pipe 208 for introducing hydrochloric acid gas used to produce gallium chloride, hydrochloric acid gas is fed into the boat during crystal growth. Then, gallium chloride gas is produced by reaction of the metal gallium 206 with the hydrochloric acid gas and is sent to the surface of the seed crystal substrate 4 through a pipe. The gallium chloride reacts with ammonia on the surface of the heated substrate and a group III nitride-based semiconductor crystal grows. It is possible to feed a doping gas into the furnace through a doping gas introducing pipe 209. The seed crystal substrate 4 as a base for crystal growth is fixed to a substrate holder 204 supported by a rotating shaft 205 and is rotated during the growth. The gases introduced into the reaction tube are guided to a detoxifying unit by a downstream exhaust pipe 210, detoxified and released to the ambient air.

Example

In this Example, a GaN crystal was firstly made by a liquid phase growth method (Na flux method) and another GaN crystal was further made thereon by a vapor phase growth method (HYPE method), as described below.

<Manufacturing of GaN Crystal by Liquid Phase Growth Method>

Firstly, a substrate formed by depositing a GaN seed crystal layer on a 65 mm-diameter sapphire substrate using the MOVPE method (vapor phase growth method) was prepared. The thickness of the sapphire substrate was 1 mm and the thickness of the GaN seed crystal layer was 5 µm. Next, the GaN seed crystal layer and the upper portion of the sapphire substrate were partially removed by etching. A GaN seed crystal substrate having seed crystals on plural raised portions of the substrate was thereby obtained. The raised portions had a circular dot shape with a diameter of 0.25 mm and were arranged in such a pattern that an equilateral triangle of side 0.55 mm with the raised portion on each vertex was repeated.

Next, crystal growth was performed on the GaN seed crystal substrate in the apparatus shown in FIG. 5 in a nitrogen gas atmosphere under the conditions below, thereby making a GaN crystal.

| | |
|---|---|
| Temperature [° C.] | 870 |
| Pressure [MPa] | 4.0 |
| Time [h] | 72 |
| GaNa | 27:73 |
| C [mol %] | 0.5 |
| Crucible | $Al_2O_3$ |

"C [mol % 0.5]" here means that the percentage of carbon powder in relation to the total amount of gallium (Ga), sodium (Na) and the carbon powder is 0.5 mol %.

To begin the operation, firstly, the crucible 114 was placed in the stainless steel container 113 and the stainless steel container 113 was then placed in an electric furnace (heat and pressure resistant container) 110. A nitrogen gas was introduced into the stainless steel container 113 from the source gas tank 120 and reacted for 72 hours to grow crystal while simultaneously heating the electric furnace (heat and pressure resistant container) 110 by a heater (not shown) so that the conditions inside the furnace became high-temperature and high-pressure of 870° C. and 40 atm (about 4.0 MPa), thereby obtaining a desired GaN crystal. At this stage, in order to have a flat c-plane at the crystal growth interface, the seed crystal was immersed in a solution having a high degree of saturation and nitrogen was efficiently supplied to recesses between the point seeds by stirring, etc.

Figure 7A:
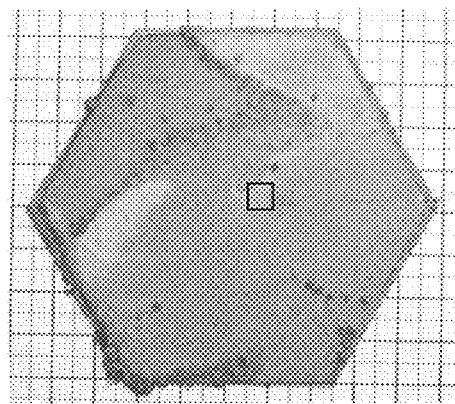
FIG. 7A is an overview photograph showing a GaN crystal grown on a flat c-plane as a growth interface in Example of the invention.
Figure 7B:
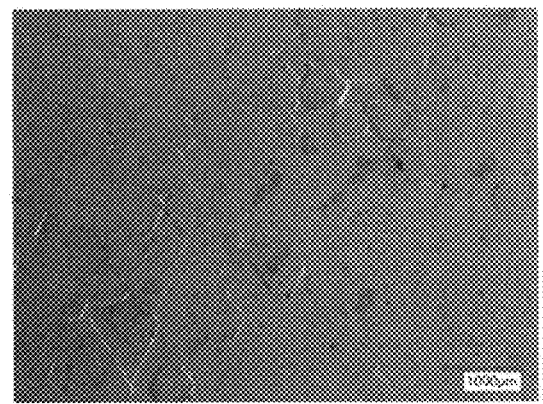
FIG. 7B is a micrograph showing a surface of the grown GaN crystal in Example of the invention.

Photographs of a surface of a GaN crystal layer formed by the above-described liquid phase growth method are shown in FIGS. 7A and 7B.

FIG. 7A is an overview photograph showing a GaN crystal grown on a flat c-plane as a growth interface in Example of the invention, and FIG. 7B is a micrograph (an enlarged image of the portion surrounded by a square in FIG. 7A) showing a surface of the grown GaN crystal.

As shown in the photographs, the obtained GaN crystal had a flat and homogeneous surface over the entire crystal. The upper portion of this GaN crystal and the sapphire substrate were removed by grinding and polishing so that only a c-plane growth portion was left, thereby obtaining a mirror-surface GaN crystal substrate having a diameter of 60 mm and a thickness of 1.0 mm. An oxygen concentration on the surface of the obtained GaN substrate measured by SIMS analysis at the center and points at distances of 10 mm and 20 mm on right and left from the center (at five points in total) was within a range of $4 \times 10^{16}$ to $8 \times 10^{16}$ $cm^{-3}$ at each point, which shows that oxygen was distributed uniformly at a very low concentration. Meanwhile, a dislocation density measured by observing dark contrast in cathodoluminescence at the same points was within range of $6 \times 10^6$ to $9 \times 10^6$ $cm^{-2}$ at each point, which confirms that dislocations were distributed uniformly at a low density. Furthermore, as a result of X-ray diffraction measurement on this substrate to estimate a radius of curvature of a c-plane, the c-plane was concave in relation to the substrate surface with a radius of curvature of 5.2 m and this shows that the curve was shallow. This GaN substrate was used as a substrate for forming a GaN crystal by the vapor phase growth method in the next step.

<Manufacturing of GaN Crystal by Vapor Phase Growth Method>

A GaN crystal was formed by a vapor phase growth method on the above-described GaN crystal substrate formed by the liquid phase growth method.

Using a 60 mm-diameter GaN substrate as a seed crystal, a thick GaN crystal was grown by the HYPE growth apparatus shown in FIG. 6. The gas flow rates during HYPE growth were 920 sccm of hydrogen as a carrier gas, 8200 sccm of nitrogen, 180 sccm of gallium chloride and 600 sccm of ammonia. Growth pressure was 100 kPa, substrate temperature during growth was 1060° C. and growth time was 15 hours. The substrate was rotated at 5 rpm during the growth. As a result, an undoped GaN crystal having a thickness of about 4.6 mm was homoepitaxially grown on the seed crystal substrate. The surface of the obtained crystal did not have any remarkable morphology abnormalities such as pits and this shows that the seed crystal did not have any polarity-reversal region.

The crystal obtained as described above was processed as follows.

Firstly, the crystal was gradually ground by a grinding wheel of a grinding machine until a region outside a diameter of 52 mm was removed, the crystal was then sliced by a wire saw, and five 635 µm-thick GaN free-standing substrates were thereby obtained from the lastly grown crystalline region. Each of the sliced substrates was shaped down to a diameter of 50.8 mm by further chamfering the outer edge, an orientation flat and an index flat were added, and the front and back surfaces were then mirror-polished, thereby obtaining five GaN free-standing substrates having a thickness of 400 to 450 µm.

Defects such as cracks or chipping did not occur in the GaN crystal during the process described above. In addition, each substrate had only a small curve (BOW) of less than 10 µm. As a result of counting the dislocation density on one of the obtained substrates using the cathodoluminescence method in the same manner as described above, the values obtained at five points within a plane were $5.8 \times 10^5$ to $9.6 \times 10^5$ $cm^{-2}$. As a result of measuring variation in inclination of the c-axis on the substrate surface by the X-ray diffractometry, the in-plane variation was within ±0.05° for each substrate. An oxygen concentration on the surface of the obtained GaN substrate measured by SIMS analysis at the center and points at distances of 10 mm and 20 mm on right and left from the center (at five points in total) was within a range of $3 \times 10^{16}$ to $5 \times 10^{16}$ $cm^{-3}$ at each point.

Comparative Example

<Manufacturing of GaN Crystal by Liquid Phase Growth Method>

The same seed crystal substrate as that in Example was prepared, and crystal growth was performed thereon in the same growth apparatus as that in Example in a nitrogen gas atmosphere commonly used in the conventional technique under the conditions below, thereby making a GaN crystal.

| | |
|---|---|
| Temperature [° C.] | 870 |
| Pressure [MPa] | 3.4 |
| Time [h] | 96 |
| GaNa | 27:73 |
| C [mol %] | 0.5 |
| Crucible | $Al_2O_3$ |

To begin the operation, firstly, the crucible 114 was placed in the stainless steel container 113 and the stainless steel container 113 was then placed in the electric furnace (heat and pressure resistant container) 110. A nitrogen gas was introduced into the stainless steel container 113 from the source gas tank 120 and reacted for 96 hours to grow crystal while simultaneously heating the electric furnace (heat and pressure resistant container) 110 by a heater (not shown) so that the conditions inside the furnace became high-temperature and high-pressure of 870° C. and 34 atm (about 3.4 MPa), thereby obtaining a desired GaN crystal. However, unlike Example, any measure was specifically taken to have a flat c-plane at the crystal growth interface.

Figure 8B:
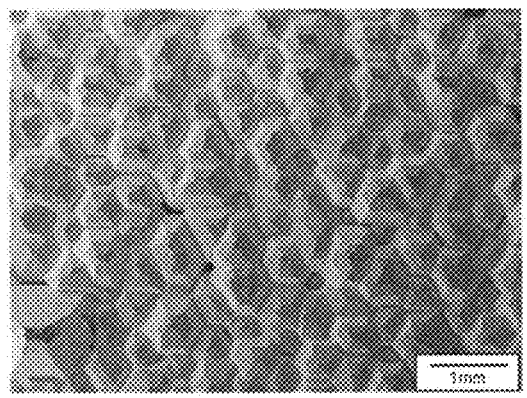
FIG. 8B is a micrograph showing a surface of the grown GaN crystal in Prior Art Example.

Photographs of a surface of a GaN crystal layer formed by the liquid phase growth method in the conventional technique as described above are shown in FIGS. 8A and 8B. FIG. 8A is an overview photograph showing a GaN crystal grown on an uneven plane as a growth interface in Prior Art Example, and FIG. 8B is a micrograph (an enlarged image of the portion surrounded by a square in FIG. 8A) showing a surface of the GaN crystal.

As shown in the photographs, the obtained GaN crystal had rough morphology with unevenness over the entire surface of the crystal. The upper portion of this GaN crystal and the sapphire substrate were removed by grinding and polishing, thereby obtaining a mirror-surface GaN crystal substrate having a diameter of 60 mm and a thickness of 1.0 mm. An oxygen concentration on the surface of the obtained GaN substrate measured by SIMS analysis at the center and points at distances of 10 mm and 20 mm on right and left from the center (at five points in total) varied depending on the measurement point in a range of $1 \times 10^{18}$ to $1 \times 10^{20}$ $cm^{-3}$. On the other hand, a dislocation density measured by observing dark contrast in cathodoluminescence at the same points was within range of $1 \times 10^5$ to $5 \times 10^6$ $cm^{-2}$ at each point, which confirms that dislocations were distributed uniformly at a low density. Furthermore, as a result of X-ray diffraction measurement on this substrate to estimate a radius of curvature of a c-plane, the c-plane was concave in relation to the substrate surface with a radius of curvature of not less than 10 m and was substantially flat. This GaN substrate was used as a substrate for forming a GaN crystal by the vapor phase growth method in the next step.

<Manufacturing of GaN Crystal by Vapor Phase Growth Method>

A GaN crystal was formed by a vapor phase growth method on the above-described GaN crystal substrate formed by the liquid phase growth method.

Using the above-described GaN substrate as a seed crystal, a crystal of GaN was homoepitaxially grown under the same conditions as those in Example. As a result, an undoped GaN crystal having a thickness of about 4.7 mm was grown on the seed crystal, but the surface thereof had morphology with minute unevenness and was not a mirror surface. In addition, a region with numerous minute cracks was present inside the crystal.

The crystal obtained as described above was gradually ground by a grinding wheel of a grinding machine until a region outside a diameter of 52 mm was removed, and an attempt to slice the crystal by a wire saw was made. However, since the crystal cracked as soon as making a cut by a wire and was broken into two pieces, it was not possible to continue the process any more.

Although the embodiment and Example of the invention have been described, the invention is not intended to be limited to the embodiment and Example, and the various kinds of modifications can be implemented without departing from the gist of the invention.

In addition, the invention according to claims is not to be limited to the above-mentioned embodiment and Example. Further, please note that all combinations of the features described in the embodiment and Example are not necessary to solve the problem of the invention.

INDUSTRIAL APPLICABILITY

The invention is applicable to a group III nitride semiconductor crystal substrate used for manufacturing a group III nitride semiconductor crystal used to form optical devices such as light-emitting diode or laser, and high-frequency devices such as diode and transistor,

REFERENCE SIGNS LIST

1 SEED CRYSTAL BASE SUBSTRATE FOR THE FLUX METHOD
2 NUCLEATION SITE (POINT SEED) FOR THE FLUX METHOD
3 ISLAND GaN CRYSTAL
3A to C, 13 GaN CRYSTAL GROWN BY THE FLUX METHOD
4, 14 GaN SEED CRYSTAL SUBSTRATE GROWN BY THE FLUX METHOD
5, 15 LOW-OXYGEN-CONCENTRATION REGION
6, 16 HIGH-OXYGEN-CONCENTRATION REGION
7, 17 GaN CRYSTAL GROWN BY THE HYPE METHOD
8 GaN SUBSTRATE GROWN BY THE HYPE METHOD
10 SEED CRYSTAL SUBSTRATE FOR THE FLUX METHOD
100 FLUX CRYSTAL GROWTH APPARATUS
110 GROWTH FURNACE
111 HEATER
112 THERMOCOUPLE
113 CRUCIBLE FIXING BASE
114 CRUCIBLE
115 MELT
120 SOURCE GAS TANK
130 PIPE
140 PRESSURE REGULATOR
150 FLOW RATE REGULATOR
200 HYPE CRYSTAL GROWTH APPARATUS (HYPE FURNACE)
201 RAW MATERIAL HEATING HEATER
202 CRYSTAL GROWTH REGION HEATING HEATER
203 REACTION TUBE

204 SUBSTRATE HOLDER
205 ROTATING SHAFT
206 METAL GALLIUM
207 AMMONIA GAS INTRODUCING PIPE
208 PIPE FOR INTRODUCING HYDROCHLORIC ACID GAS USED TO PRODUCE GALLIUM CHLORIDE
209 DOPING GAS INTRODUCING PIPE
210 EXHAUST PIPE

The invention claimed is:

1. A method for manufacturing a group III nitride semiconductor crystal substrate, the method comprising:
providing, as a seed crystal substrate, a group III nitride single crystal grown by a liquid phase growth method; and
homoepitaxially growing a group III nitride single crystal by a vapor phase growth method on a principal surface of the seed crystal substrate,
wherein the principal surface of the seed crystal substrate includes a +c-plane,
wherein an entirety of a surface of the seed crystal substrate has an atomic oxygen concentration of not more than $1 \times 10^{17}$ cm$^{-3}$ in a crystal near the principal surface over an entire in-plane region thereof, and
wherein the seed crystal substrate comprises, at least on the principal surface, a crystalline region grown in a state that a flat growth interface in a two-dimensional growth mode is maintained during crystal growth.

2. The method for manufacturing a group III nitride semiconductor crystal substrate according to claim 1, wherein the group III nitride single crystal grown on the seed crystal substrate by the vapor phase growth method has an atomic oxygen concentration of not more than $1 \times 10^{17}$ cm$^{-3}$ in the crystal.

3. The method for manufacturing a group III nitride semiconductor crystal substrate according to claim 1, wherein the seed crystal substrate comprises a crystal that is grown while gradually transitioning a shape of a growth interface during the crystal growth, from an uneven growth interface in a three-dimensional growth mode to the flat growth interface in the two-dimensional growth mode.

4. The method for manufacturing a group III nitride semiconductor crystal substrate according to claim 1, wherein at least the principal surface of the seed crystal substrate is mirror-polished.

5. The method for manufacturing a group III nitride semiconductor crystal substrate according to claim 1, wherein an average dislocation density on the surface of the seed crystal substrate is not more than $1 \times 10^7$ cm$^{-2}$.

6. A method for manufacturing a group III nitride semiconductor crystal substrate, the method comprising:
providing, as a seed crystal substrate, a group III nitride single crystal grown by a liquid phase growth method; and
homoepitaxially growing a group III nitride single crystal by a vapor phase growth method on a principal surface of the seed crystal substrate,
wherein the principal surface the seed crystal substrate includes a +c-plane,
wherein an entirety of a surface of the seed crystal substrate has an atomic oxygen concentration of not more than $1 \times 10^7$ cm$^{-3}$ in a crystal near the principal surface over an entire in-lane region thereof, and
wherein a c-plane of the seed crystal substrate has inside the crystal a warpage that is concave surface-shaped toward the principal surface.

7. The method for manufacturing a group III nitride semiconductor crystal substrate according to claim 6, wherein the seed crystal substrate has a diameter of not less than 50 mm, and
wherein the c-plane thereof has, inside the crystal, a warpage that is concave surface-shaped toward the principal surface and not less than 5 m in a curvature radius.

8. The method for manufacturing a group III nitride semiconductor crystal substrate according to claim 1, wherein the liquid phase growth method includes a flux method.

9. The method for manufacturing a group III nitride semiconductor crystal substrate according to claim 1, wherein the vapor phase growth method includes a hydride vapor phase epitaxy (HVPE) method, and
wherein the group III nitride single crystal, having a larger thickness than the seed crystal substrate, is homoepitaxially grown on the seed crystal substrate by the HVPE method.

10. The method for manufacturing a group III nitride semiconductor crystal substrate according to claim 1, wherein the seed crystal substrate is made using, as a starting substrate, a seed crystal-forming substrate or a point-seed substrate with a plurality of group III nitride seed crystals formed thereon.

11. The method for manufacturing a group III nitride semiconductor crystal substrate according to claim 1, wherein no polarity-reversal region is present at least on the principal surface of the seed crystal substrate.

12. The method for manufacturing a group III nitride semiconductor crystal substrate according to claim 1, wherein at least one or more group III nitride single crystal free-standing substrates are made from the group III nitride single crystal grown by the vapor phase growth method.

13. The method for manufacturing a group III nitride semiconductor crystal substrate according to claim 1, wherein the group III nitride comprises GaN.

14. A method for manufacturing a group III nitride semiconductor crystal substrate the method comprising:
providing, as a seed crystal substrate, a group III nitride single crystal grown by a liquid phase growth method; and
homoepitaxially growing a group III nitride single crystal by a vapor phase growth method on a principal surface of the seed crystal substrate,
wherein the principal surface of the seed crystal substrate includes a +c-plane,
wherein an entirety of a surface of the seed crystal substrate has an atomic oxygen concentration of not more than $1 \times 10^{17}$ cm$^{-3}$ in a crystal near the principal surface over an entire in-plane region thereof, and
wherein a growth surface includes a flat c-plane in the liquid phase growth method.

15. A method for manufacturing a group III nitride semiconductor crystal substrate, the method comprising:
providing, as a seed crystal substrate, a group III nitride single crystal grown by a liquid chase growth method; and
homoepitaxially growing a group III nitride single crystal by a vapor phase growth method on a principal surface of the seed crystal substrate,
wherein the principal surface of the seed crystal substrate includes a +c-plane,
wherein an entirety of a surface of the seed crystal substrate has a atomic oxygen concentration of not more than $1\times10^7$ cm$^{-3}$ in a crystal near the principal surface over an entire in-plane region thereof, and wherein an incorporated oxygen concentration in the crystal varies depending on a plane orientation of a crystal growth interface.

16. A method for manufacturing a group III nitride semiconductor crystal substrate the method comprising:

providing, as a seed crystal substrate, a group III nitride single crystal grown by a liquid phase growth method; and homoepitaxially growing a group III nitride single crystal by a vapor phase growth method on a principal surface of the seed crystal substrate, wherein the principal surface of the seed crystal substrate includes a +c-plane, wherein an entirety of a surface of the seed crystal substrate has an atomic oxygen concentration of not more than $1\times10^{17}$ cm$^{-3}$ in a crystal near the principal surface over an entire in-region thereof, and wherein the atomic oxygen concentration is within a range from $3\times10^{16}$ cm$^{-3}$ to $5\times10^{16}$ cm$^{-3}$.

17. A method for manufacturing a group III nitride semiconductor crystal substrate, the method comprising:

providing, as a seed crystal substrate, a group III nitride single crystal grown by a liquid phase growth method; and homoepitaxially growing a group III nitride single crystal by a vapor vase growth method on a principal surface of the seed crystal substrate, wherein the principal surface of the seed crystal substrate includes a +c-plane, wherein an entirety of a surface of the seed crystal substrate has an atomic oxygen concentration of not more than $1\times10^{17}$ cm$^{-3}$ in a crystal near the principal surface over an entire in-plane region thereof, and wherein the near the principal surface includes a region within 20 μm in depth from the principal surface.

18. A method for manufacturing group III nitride semiconductor crystal substrate, the method comprising:

providing, as a seed crystal substrate, a group III nitride single crystal grown by a liquid phase growth method; and homoepitaxially growing a group III nitride single crystal by vapor has growth method on a principal surface of the seed crystal substrate, wherein the principal surface of the seed crystal substrate includes a +c-plane, wherein entirety of a surface of the seed crystal substrate has an atomic oxygen concentration of not more than $1\times10^{17}$ cm$^{-3}$ in a crystal near the principal surface over an entire in-plane region thereof, and wherein a dislocation density in the group III nitride single crystal grown by the vapor phase growth method is not more than $1\times10^7$ cm$^{-2}$.

19. A method for manufacturing a group III nitride semiconductor crystal substrate, the method comprising:

providing, as a seed crystal substrate a group III nitride single crystal grown by a liquid phase growth method; and homoepitaxially growing a group III nitride single crystal by a vapor phase growth method on a principal surface of the seed crystal substrate, wherein the principal surface of the seed crystal substrate includes a +c-plane, wherein an entirety of a surface of the seed crystal substrate has an atomic oxygen concentration of not more than $1\times10^{17}$ cm$^{-3}$ in a crystal near the principal surface over an entire in-plane region thereof, and wherein the seed crystal substrate is free of a region of an N-polar face with reversed polarity partially emerged on a Ga-polar face of the principal surface.

* * * * *